(12) United States Patent
Choi et al.

(10) Patent No.: US 12,457,833 B2
(45) Date of Patent: Oct. 28, 2025

(54) ELECTRONIC DEVICE AND ITS REPAIR METHOD

(71) Applicant: Electronics and Telecommunications Research Institute, Daejeon (KR)

(72) Inventors: Kwang-Seong Choi, Daejeon (KR); Yong-Sung Eom, Daejeon (KR); Jiho Joo, Daejeon (KR); Gwang-Mun Choi, Daejeon (KR); Seok-Hwan Moon, Daejeon (KR); Ho-Gyeong Yun, Daejeon (KR); Chanmi Lee, Daejeon (KR); Ki-Seok Jang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 702 days.

(21) Appl. No.: 17/864,774

(22) Filed: Jul. 14, 2022

(65) Prior Publication Data
US 2023/0027892 A1   Jan. 26, 2023

(30) Foreign Application Priority Data
Jul. 22, 2021   (KR) .......................... 10-2021-0096202

(51) Int. Cl.
*H10H 20/857* (2025.01)
*H01L 25/075* (2006.01)
*H10H 20/01* (2025.01)

(52) U.S. Cl.
CPC ....... *H10H 20/857* (2025.01); *H01L 25/0753* (2013.01); *H10H 20/01* (2025.01); *H10H 20/0364* (2025.01)

(58) Field of Classification Search
CPC ... H01H 20/857; H10H 20/01; H01L 25/0753
See application file for complete search history.

(56) References Cited

U.S. PATENT DOCUMENTS 8,563,993 B2   10/2013   Shirouzu et al.
8,791,474 B1 *   7/2014   Bibl ..................... G09G 3/2003
                                                                257/89
(Continued)

FOREIGN PATENT DOCUMENTS

KR     10-1553463 B1   9/2015
KR     10-1723255 B1   4/2017
(Continued)

OTHER PUBLICATIONS

Liao, Zhishen, et al. "A New Flexure-based Parallel Laser Deflection Device for MicroLED Repair." *2020 21st International Conference on Electronic Packaging Technology (ICEPT)*. IEEE, 2020.
(Continued)

*Primary Examiner* — Michael Jung
(74) *Attorney, Agent, or Firm* — NSIP Law

(57) ABSTRACT

Provided is an electronic device including a plurality of substrate electrodes on a substrate, the substrate electrodes including initial electrodes and spare electrodes, a bonding material covering the initial electrodes and the spare electrodes, module structures respectively provided on first initial electrodes of the initial electrodes, and solders between each of the first initial electrodes and each of the module structures, wherein the spare electrodes include second spare electrodes, wherein the module structures are not provided on the second spare electrodes, wherein the bonding material on the first initial electrodes is harder than the bonding material on the second spare electrodes.

20 Claims, 16 Drawing Sheets

(56) References Cited

U.S. PATENT DOCUMENTS

| | | | |
|---|---|---|---|
| 9,235,463 | B2 | 1/2016 | Moon et al. |
| 10,593,852 | B2 | 3/2020 | Chen et al. |
| 2012/0260987 | A1 | 10/2012 | Yun et al. |
| 2019/0312110 | A1* | 10/2019 | Costa .................... H01L 21/561 |
| 2021/0265327 | A1 | 8/2021 | Koo et al. |
| 2021/0280741 | A1* | 9/2021 | Lo ......................... H10D 86/423 |
| 2022/0149110 | A1* | 5/2022 | Tang ...................... H10H 20/01 |
| 2023/0015183 | A1* | 1/2023 | Namiki ............... H01L 25/0753 |

FOREIGN PATENT DOCUMENTS

| | | | |
|---|---|---|---|
| KR | 10-2019-0143323 A | 12/2019 |
| KR | 10-2020-0007498 A | 1/2020 |
| KR | 10-2021-0025126 A | 3/2021 |

OTHER PUBLICATIONS

Choi, Kwang-Seong, et al. "Simultaneous Transfer and Bonding (SITRAB) Process for Micro-LEDs Using Laser-Assisted Bonding with Compression (LABC) Process and SITRAB Adhesive." *2021 IEEE 71st Electronic Components and Technology Conference (ECTC)*. IEEE, 2021.

Choi, Kwang-Seong, "Simultaneous Transfer and Bonding (SITRAB) Process for Mini-LED Display" Samsung Advanced Institute of Technology Seminar (Nov. 6, 2020).

Choi, Kwang-Seong, et al. "Simultaneous Transfer and Bonding (SITRAB) Process for MiniLED Display." *Society for Information Display International Symposium Digest of Technical Papers*. 2021.

J.H.Lee "Interconnection Technology in Electronic Packaging" *Micro Nano Interconnection Lab. Seoul National University of Science & Technology* (Oct. 18, 2010).

Honda, Kazutaka, et al. "NCF for pre-applied process in higher density electronic package including 3D-package." *2012 IEEE 62nd Electronic Components and Technology Conference*. IEEE, 2012.

Jung, Yanggyoo, et al. "Development of next generation flip chip interconnection technology using homogenized laser-assisted bonding." *2016 IEEE 66th Electronic Components and Technology Conference (ECTC)*. IEEE, 2016.

Hsu, Ian, et al. "7nm chip-package interaction study on a fine pitch flip chip package with laser assisted bonding and mass reflow technology." *2019 IEEE 69th Electronic Components and Technology Conference (ECTC)*. IEEE, 2019.

Choi, Kwang-Seong, et al. "Interconnection technology based on InSn solder for flexible display applications." *ETRI Journal* 37.2 (2015): 387-394.

Taneja, D., et al. "Understanding the behavior of SnAg bumps at 10 um pitch and below for imaging and microdisplay application." *2016 IEEE 66th Electronic Components and Technology Conference (ECTC)*. IEEE, 2016.

Marion, F., et al. "A room temperature flip-chip technology for high pixel count micro-displays and imaging arrays." *2016 IEEE 66th Electronic Components and Technology Conference (ECTC)*. IEEE, 2016.

Derakhshandeh, Jaber, et al. "Die to wafer 3D stacking for below 10um pitch microbumps." *2016 IEEE International 3D Systems Integration Conference (3DIC)*. IEEE, 2016.

Derakhshandeh, Jaber, et al. "10 and 7 μm Pitch Thermo-compression Solder Joint, Using A Novel Solder Pillar And Metal Spacer Process." *2020 IEEE 70th Electronic Components and Technology Conference (ECTC)*. IEEE, 2020.

Choi, Kwang-Seong, et al. "Enhanced Performance of Laser-Assisted Bonding with Compression (LABC) Compared with Thermal Compression Bonding (TCB) Technology." *2019 IEEE 69th Electronic Components and Technology Conference (ECTC)*. IEEE, 2019.

* cited by examiner

ELECTRONIC DEVICE AND ITS REPAIR METHOD

CROSS-REFERENCE TO RELATED APPLICATIONS

This U.S. non-provisional patent application claims priority under 35 U.S.C. § 119 of Korean Patent Application No. 10-2021-0096202, filed on Jul. 22, 2021, the entire contents of which are hereby incorporated by reference.

BACKGROUND

The present disclosure relates to an electronic device including a display, a semiconductor, a sensor, an active element and/or a passive element, and a repair method thereof.

In order to manufacture an electronic device including a light emitting element, a semiconductor, a sensor, an active element and/or a passive element, and the like, Anisotropic Conductive Paste (ACP) and/or Anisotropic Conductive Film (ACF) may be used in the process of bonding an electronic module to a substrate. ACP and ACF are composed of a polymer, and after the bonding process, the polymers constituting ACP and ACF are hardened, thereby making it difficult to remove ACP and ACF. Accordingly, the time required for the repair process for replacing the defective device bonded on the substrate with the ACP or ACF with a normal device is increased, and as a result, there is an issue in that the process yield is reduced and the product price is increased.

SUMMARY

The present disclosure provides an electronic device including spare electrodes and a bonding material having a low laser absorption rate in order to shorten the time required for a repair process.

The present disclosure also provides a method for repairing an electronic device in which the repair process is simple and the required time is reduced through laser irradiation.

An embodiment of the inventive concept provides a electronic device including: a plurality of substrate electrodes on a substrate, the substrate electrodes including initial electrodes and spare electrodes; a bonding material covering the initial electrodes and the spare electrodes; module structures respectively provided on first initial electrodes of the initial electrodes; and solders between each of the first initial electrodes and each of the module structures, wherein the spare electrodes include second spare electrodes, wherein the module structures are not provided on the second spare electrodes, wherein the bonding material on the first initial electrodes is harder than the bonding material on the second spare electrodes.

In an embodiment of the inventive concept, a method of repairing an electronic device including a plurality of substrate electrodes on a substrate, wherein the substrate electrodes include initial electrodes and spare electrodes, a bonding material covering the initial electrodes and the spare electrodes, module structures electrically connected to the initial electrodes, and initial solders between the initial electrodes and the module structures, includes: curing the bonding material on the initial electrodes more than the bonding material on the spare electrodes; destroying at least one defective module structure of the module structures; disposing the new module structures on corresponding ones of the spare electrodes; and curing the bonding material on the corresponding spare electrodes by irradiating a laser to the new module structures.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

In order to fully understand the configuration and effects of the inventive concept, preferred embodiments of the inventive concept will be described in detail with reference to the accompanying drawings. The inventive concept is not limited to the embodiments disclosed below, but may be implemented in various forms, and various modifications and changes may be added. However, it is provided to completely disclose the technical idea of the inventive concept through the description of the present embodiments, and to fully inform a person of ordinary skill in the art to which the inventive concept belongs. In the accompanying drawings, the components are shown to be enlarged in size for convenience of description, and the ratio of each component may be exaggerated or reduced.

Figure 1:
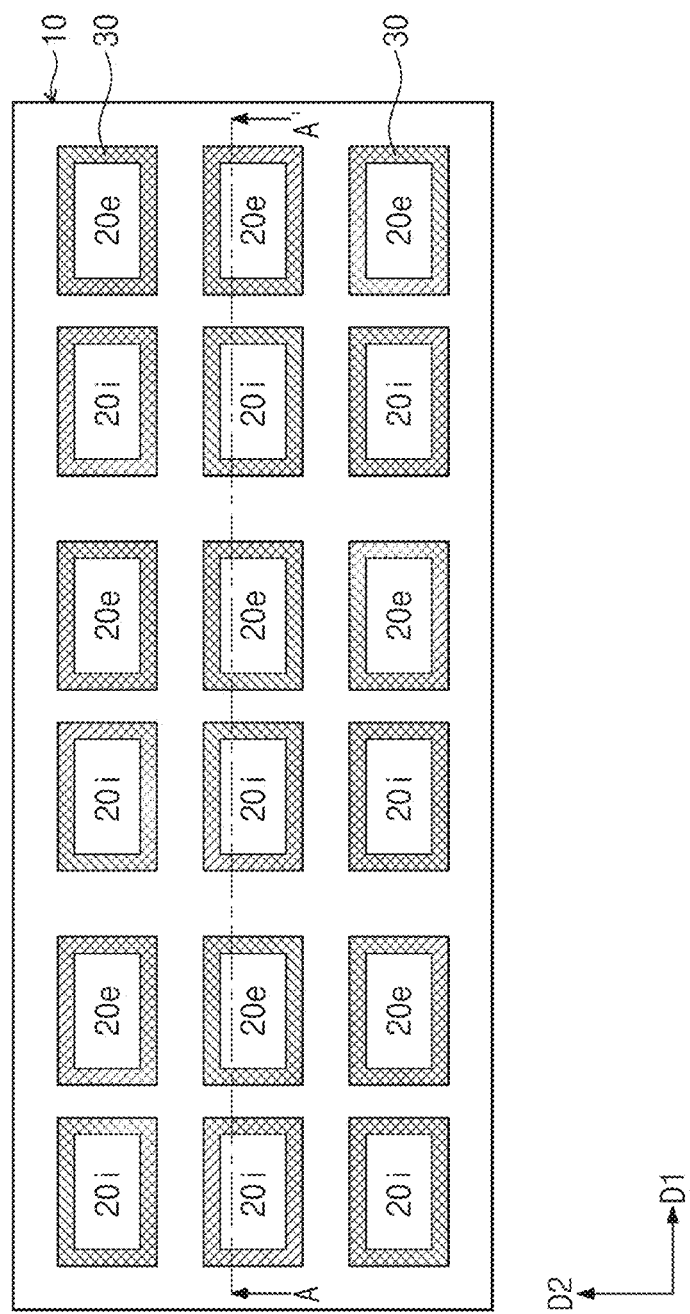
FIG. 1 is a plan view illustrating an electronic device according to embodiments of the inventive concept.
Figure 2:
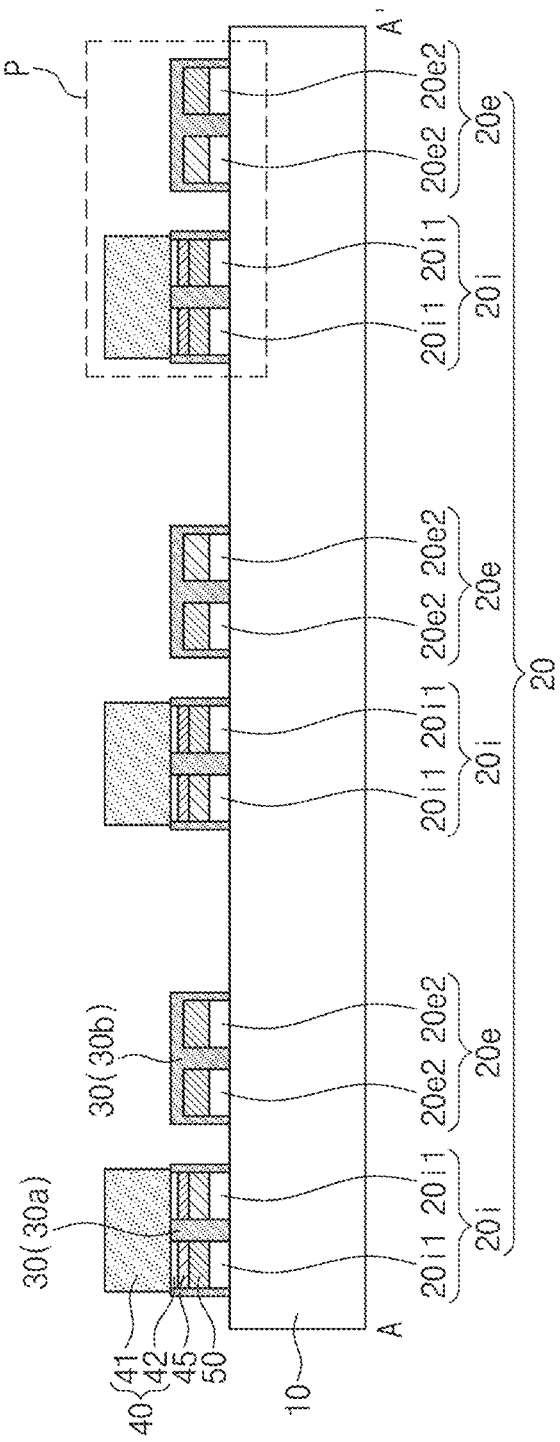
FIG. 2 is a cross-sectional view taken along line A-A' of FIG. 1 showing an electronic device according to embodiments of the inventive concept.
Figure 3:
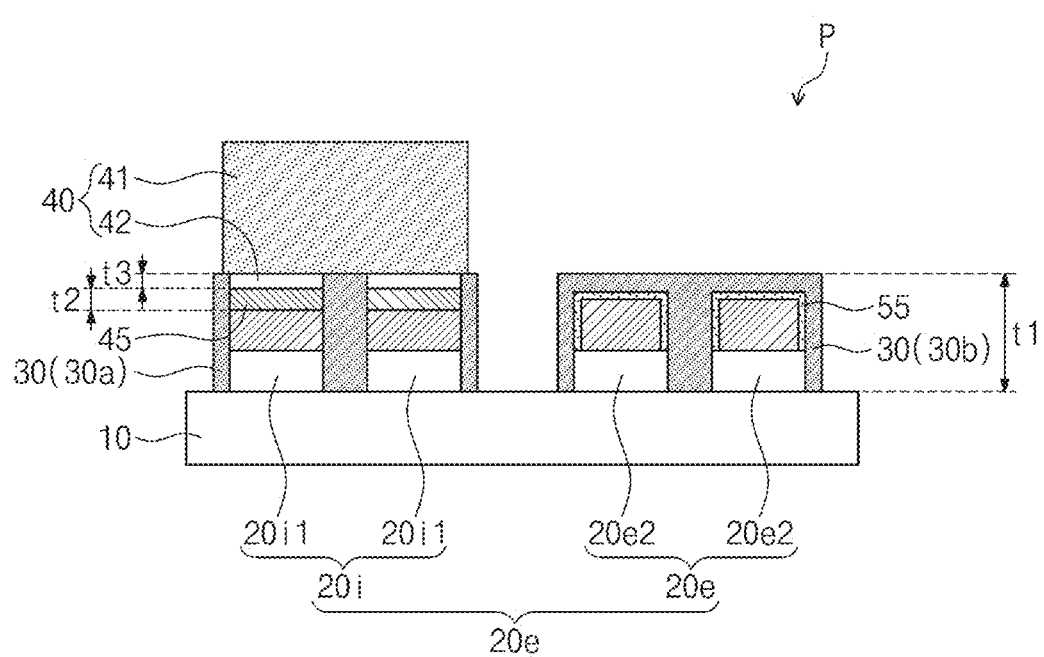
FIG. 3 is a view showing an electronic device according to embodiments of the inventive concept, and is an enlarged view taken along a portion P of FIG. 2.

FIG. 1 is a plan view illustrating an electronic device according to embodiments of the inventive concept. FIG. 2 is a cross-sectional view taken along line A-A' of FIG. 1 showing an electronic device according to embodiments of the inventive concept. FIG. 3 is a view showing an electronic device according to embodiments of the inventive concept, and is an enlarged view taken along a portion P of FIG. 2.

Referring to FIGS. 1 to 3, a plurality of substrate electrodes 20 may be provided on a substrate 10. In a plan view, the substrate electrodes 20 may be spaced apart from each other in a first direction D1 and a second direction D2 parallel to the upper surface of the substrate 10. The first direction D1 and the second direction D2 may cross each other. However, this is merely exemplary, and the inventive concept is not limited thereto.

The substrate electrodes 20 may include initial electrodes 20i and spare electrodes 20e. The number ratio of the initial electrodes 20i and the spare electrodes 20e may be 1:1.

The spare electrodes 20e may be substantially the same as the corresponding initial electrodes 20i of the initial electrodes 20i, respectively. During the repair process, the spare electrodes 20e may replace the corresponding initial electrodes 20i, respectively. The spare electrodes 20e may be disposed adjacent to the corresponding initial electrode 20i, respectively, but the embodiment of the inventive concept is not limited thereto.

As an example, two initial electrodes 20i are disposed, and two spare electrodes 20e corresponding to the two initial electrodes 20i may be disposed adjacent to the two initial electrodes 20i. A distance between the two initial electrodes 20i and the two spare electrodes 20e may be closer than a distance between the two initial electrodes 20i and other spare electrodes 20e that do not correspond thereto.

The initial electrodes 20i may include first initial electrodes 20i1. The module structures 40 may be provided on the first initial electrodes 20i1 of the initial electrodes 20i, respectively.

The spare electrodes 20e may include second spare electrodes 20e2. The module structures 40 may not be provided on the second spare electrodes 20e2.

The module structures 40 may include electronic modules 41. The electronic modules 41 may include any one of a semiconductor, a sensor, an active element, or a passive element. For example, the module structures 40 may include the electronic modules 41 including an active element such as a micro LED chip. The electronic modules 41 may have high thermal conductivity, and accordingly, the thermal conductivity of the module structures 40 may be high.

Solders 50 may be disposed between each of the first initial electrodes 20i1 and each of the module structures 40. The solders 50 may be further provided on the second spare electrodes 20e2, respectively.

The solders 50 may include at least one of Sn, or In or combination thereof. The solders 50 may include a composition including at least one of Sn, or In or combination thereof, and for example, may include at least one of Sn, SnAg, SnAgCu, SnIn, In, InBi, SnBi, InBi, or Sn or combination thereof.

The solders 50 on the respective second spare electrodes 20e2 may include oxide layers 55 on a surface thereof. The oxide layers 55 may include the same metal as the solders 50.

Metal compound patterns 45 may be further disposed between each of the module structures 40 and each of the solders 50. The metal compound patterns 45 may include the same metal as the solders 50. The thickness t2 of the metal compound patterns 45 may be greater than 0 μm and less than or equal to 2 μm. When the thickness of the metal compound patterns 45 is greater than 2 μm, the thickness of the solders 50 may be reduced, and thus electrical characteristics of the electronic device may be deteriorated.

The module structures 40 may further include module electrodes 42. The module electrodes 42 may be adjacent to the metal compound patterns 45. In detail, the module electrodes 42 may contact the metal compound patterns 45. The electronic modules 41 may be provided on the module electrodes 42, and the module electrodes 42 may be disposed between the electronic module 41 and the metal compound patterns 45. The thickness t3 of the module electrodes 42 may be 10 nm or more. The module electrodes 42 may have high thermal conductivity, and accordingly, the thermal conductivity of the module structures 40 may be high.

The substrate electrodes 20 may be covered with a bonding material 30. That is, the bonding material 30 may cover the initial electrodes 20i and the spare electrodes 20e. The bonding material 30 may further cover the solders 50 and the module electrodes 42.

According to embodiments of the inventive concept, the bonding material 30 may be in the form of a paste. When the bonding material 30 is in the form of a paste, the bonding material 30 may be provided only in areas on the substrate 10 in which the substrate electrodes 20 are provided and in some areas around the substrate electrodes 20. In other words, the bonding material 30 may not be provided on the remaining area of the substrate 10 except for areas in which the substrate electrodes 20 are provided and some areas around the substrate electrodes 20.

The bonding material 30 may include a base material, a reducing agent, and a curing agent. The base material may include a thermosetting resin. The thermosetting resin may include, for example, at least one of epoxy, phenoxy, bismaleimide, unsaturated polyester, urethane, urea, phenol-formaldehyde, vulcanized rubber, melamine resin, polyimide, epoxy novolac resin, cyanate ester, or silicone-based resin or combination thereof, but the embodiment of the inventive concept is not limited thereto. The bonding material 30 may be cured when the temperature rises due to the thermosetting resin. The base material may further include an acrylic resin. The base material may not include a halogen.

The reducing agent may include at least one of a hydroxyl group (—OH), or a carboxyl group (—COOH) or combination thereof. The curing agent may be cured by reacting with the base material. The curing agent may include, for example, at least one of aliphatic amine, aromatic amine, cycloaliphatic amine, phenalkamine, imidazole, carboxylic acid, anhydride, polyamide-based hardeners, phenolic curing agents, or waterborne curing agents or combination thereof, but the embodiment of the inventive concept is not limited thereto.

The bonding material 30 may be transparent. Therefore, when a laser is irradiated to the bonding material 30, the absorption rate of the bonding material 30 with respect to the laser may be low. Specifically, with respect to the laser having a wavelength of 200 nm or more and 2 μm or less, the laser absorption rate of the bonding material 30 may be greater than 0% and less than 30%. The thickness t1 of the bonding material 30 may be greater than 0 μm and less than or equal to 70 μm. The laser absorption rate of the bonding material 30 may be lower than the laser absorption rate of the module structures 40. These characteristics may be used in the repair process of the electronic device, and details in relation thereto will be described in the embodiment of the repair method of the electronic device.

The bonding material 30 may have a different degree of curing on each of the initial electrodes 20i and each of the spare electrodes 20e. In detail, the bonding material 30a on the first initial electrodes 20i1 may be harder than the bonding material 30b on the second spare electrodes 20e2.

As the bonding material 30a on the first initial electrodes 20i1 is cured, the module structures 40 bonded to the first initial electrodes 20i1 may be fixed. By not curing the bonding material 30b on the second spare electrodes 20e2, during the repair process to be described with reference to FIGS. 8 to 13, a separate process for removing the cured bonding material 30*a* may be omitted. Accordingly, the time required for the repair process may be reduced.

Figure 4:
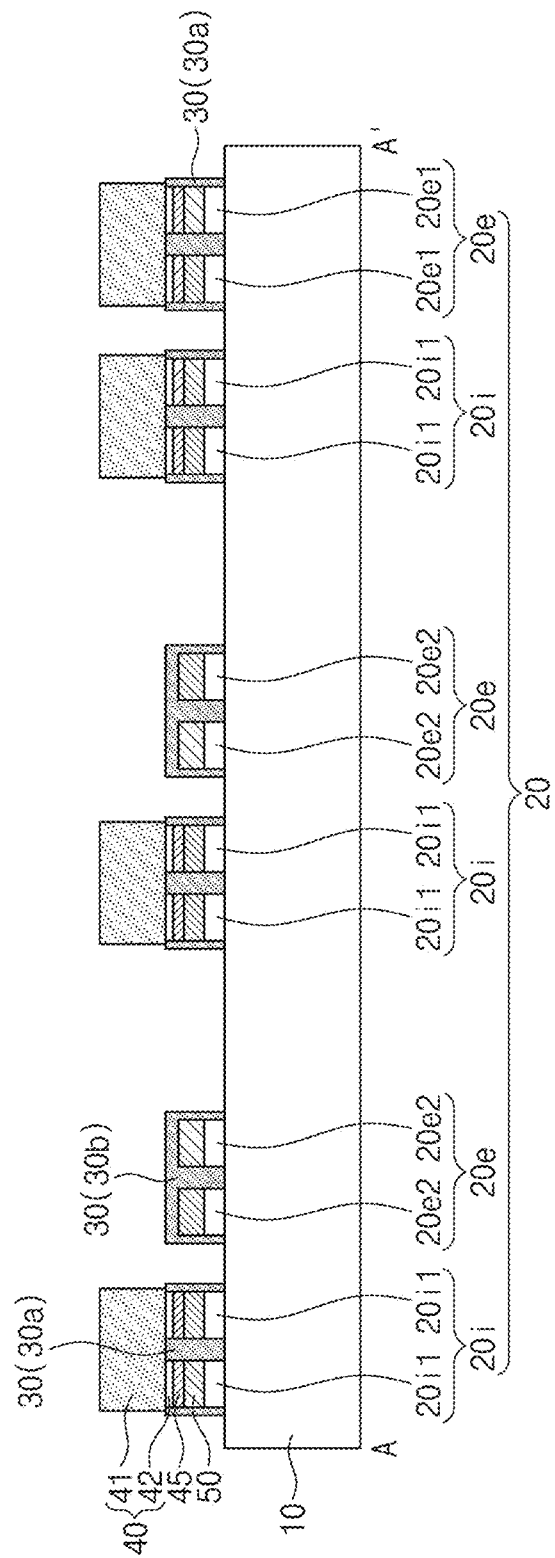
FIGS. 4 and 5 are views illustrating electronic devices according to embodiments of the inventive concept, and are cross-sectional views taken along line A-A' of FIG. 1.
Figure 5:
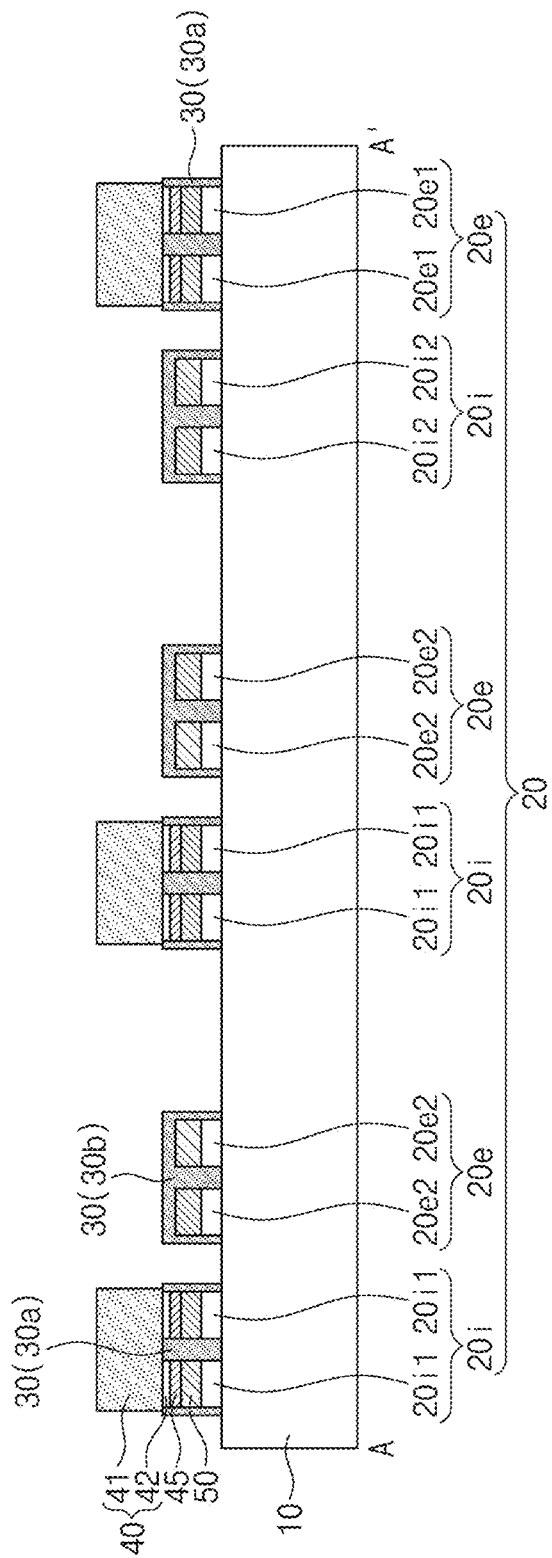

FIGS. 4 and 5 are views illustrating electronic devices according to embodiments of the inventive concept, and are cross-sectional views taken along line A-A' of FIG. 1.

FIGS. 2, 4 and 5, the initial electrodes 20*i* may further include second initial electrodes 20*i*2. The module structures 40 may not be provided on the second initial electrodes 20*i*2. The spare electrodes 20*e* may further include first spare electrodes 20*e*1. The module structures 40 may be provided on the first spare electrodes 20*e*1, respectively. The bonding material 30*a* on the first spare electrodes 20*e*1 may be harder than the bonding material 30*b* on the second spare electrodes 20*e*2.

The module structure 40 may be provided on at least one initial electrode 20*i* of the initial electrodes 20*i* or at least one spare electrode 20*e* corresponding to the initial electrode 20*i*. That is, when any one of the initial electrodes 20*i* is the second initial electrode 20*i*2, the spare electrode 20*e* corresponding to the second initial electrode 20*i*2 may be the first spare electrode 20*e*1. When any one of the initial electrodes 20*i* is the first initial electrode 20*i*1, the spare electrode 20*e* corresponding to the first initial electrode 20*i*1 may be either the first spare electrode 20*e*1 or the second spare electrode 20*e*2.

For example, referring to FIG. 2, the initial electrodes 20*i* may be first initial electrodes 20*i*1. Accordingly, the module structures 40 may be provided on the initial electrodes 20*i*, that is, the first initial electrodes, respectively. In this case, the spare electrodes 20*e* corresponding to the initial electrodes 20*i* (i.e., the first initial electrodes) may be second spare electrodes 20*e*2. The module structures 40 may not be provided on the corresponding spare electrodes 20*e*.

For example, referring to FIG. 4, the initial electrodes 20*i* may be first initial electrodes 20*i*1. In this case, some of the spare electrodes 20*e* corresponding to the initial electrodes 20*i* may be the first spare electrodes 20*e*1. The remainder of the corresponding spare electrodes 20*e* may be second spare electrodes 20*e*2.

As another example, referring to FIG. 5, some of the initial electrodes 20*i* may be first initial electrodes 20*i*1. The spare electrodes 20*e* corresponding to some of the initial electrodes 20*i* may be second spare electrodes 20*e*2. The rest of the initial electrodes 20*i* may be second initial electrodes 20*i*2. The spare electrodes 20*e* corresponding to the rest of the initial electrodes 20*i* may be first spare electrodes 20*e*1.

Figure 6A:
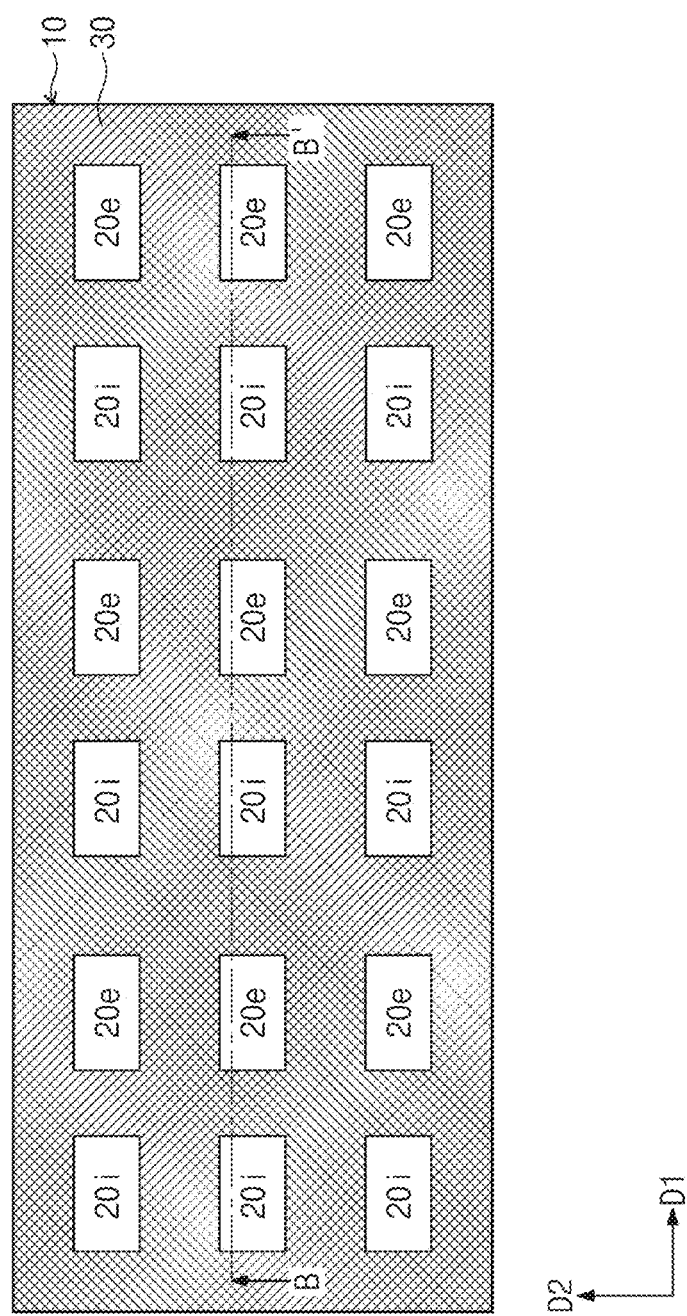
FIGS. 6A and 6B are plan views illustrating electronic devices according to embodiments of the inventive concept.
Figure 6B:
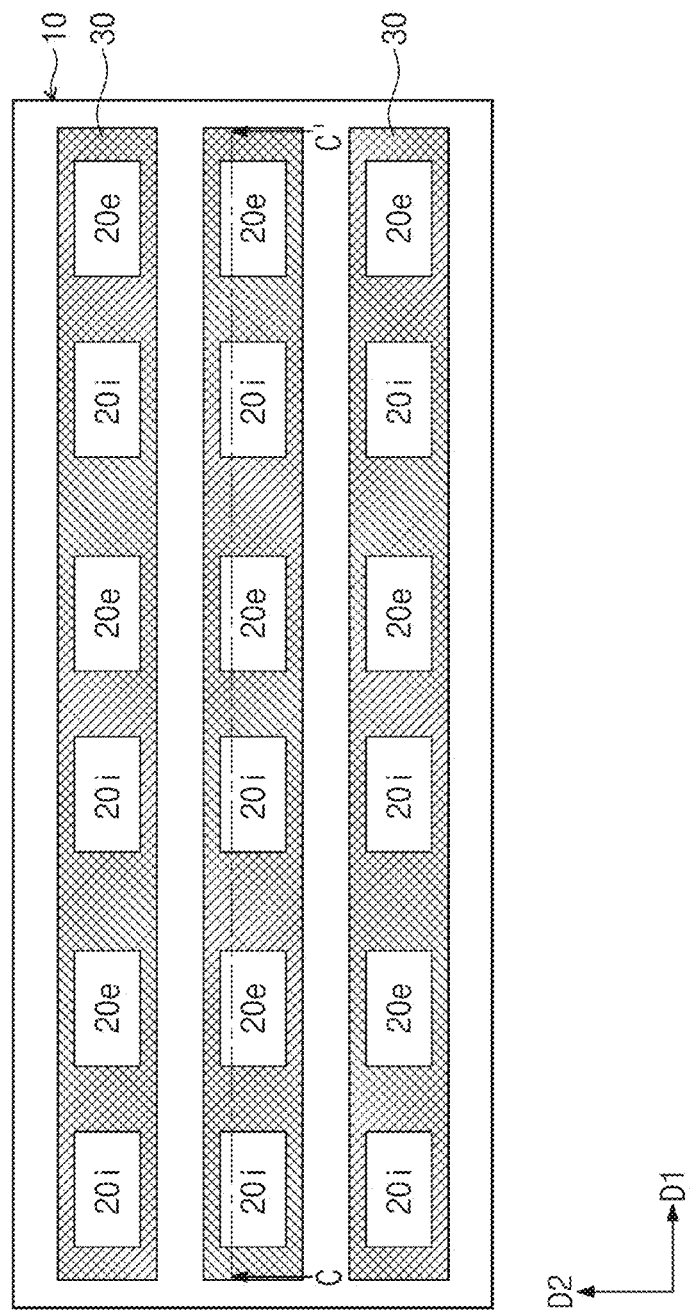
Figure 7:
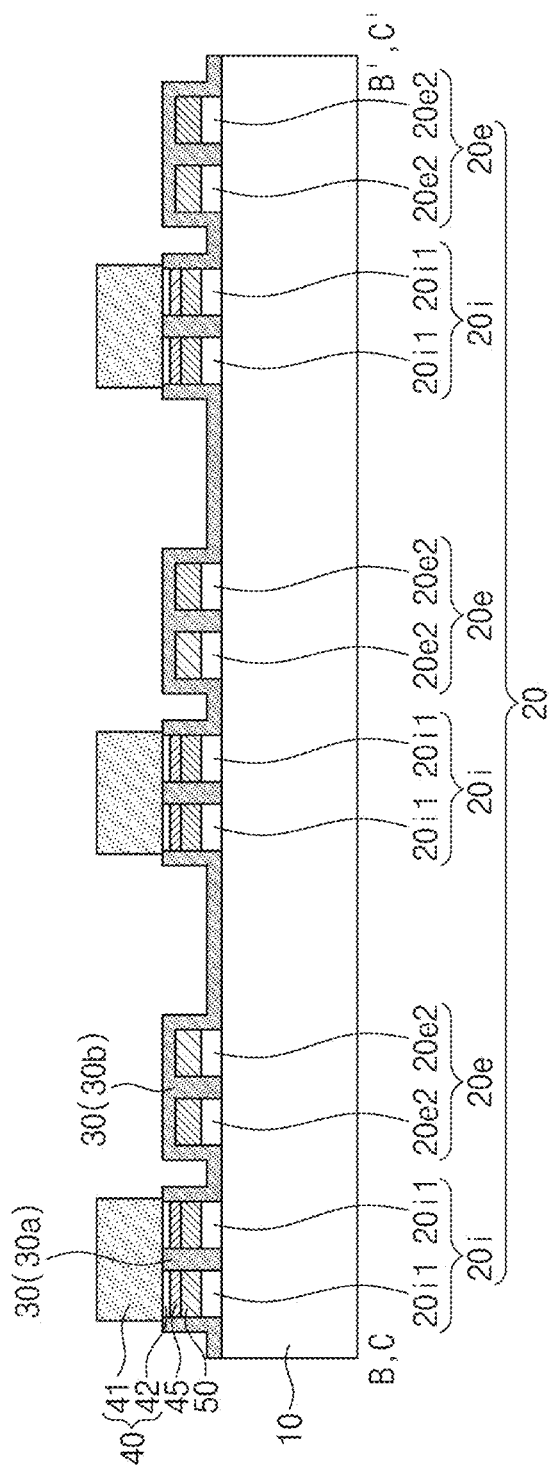
FIG. 7 is a view illustrating an electronic device according to embodiments of the inventive concept, and is a cross-sectional view taken along line B-B' of FIG. 6A and line C-C' of FIG. 6B.

FIGS. 6A and 6B are plan views illustrating electronic devices according to embodiments of the inventive concept. FIG. 7 is a view illustrating an electronic device according to embodiments of the inventive concept, and is a cross-sectional view taken along line B-B' of FIG. 6A and line C-C' of FIG. 6B. For brevity of description, descriptions of contents overlapping those of FIGS. 1 to 3 will be omitted.

Referring to FIGS. 6A, 6B and 7, the bonding material 30 may be in the form of a film. When the bonding material 30 is in the form of a film, the bonding material 30 may cover at least a portion of the substrate 10.

For example, referring to FIGS. 6A and 7, the bonding material 30 may be provided on the entire area of the substrate 10 to cover the substrate electrodes 20.

As another example, referring to FIGS. 6B and 7, the bonding material 30 may be provided to have a line shape extending in the first direction D1 and spaced apart from each other in the second direction D2. In this case, the bonding material 30 may cover the substrate electrodes arranged in the first direction D1 and the substrate therebetween. However, this is merely exemplary, and the inventive concept is not limited thereto.

Figure 8:
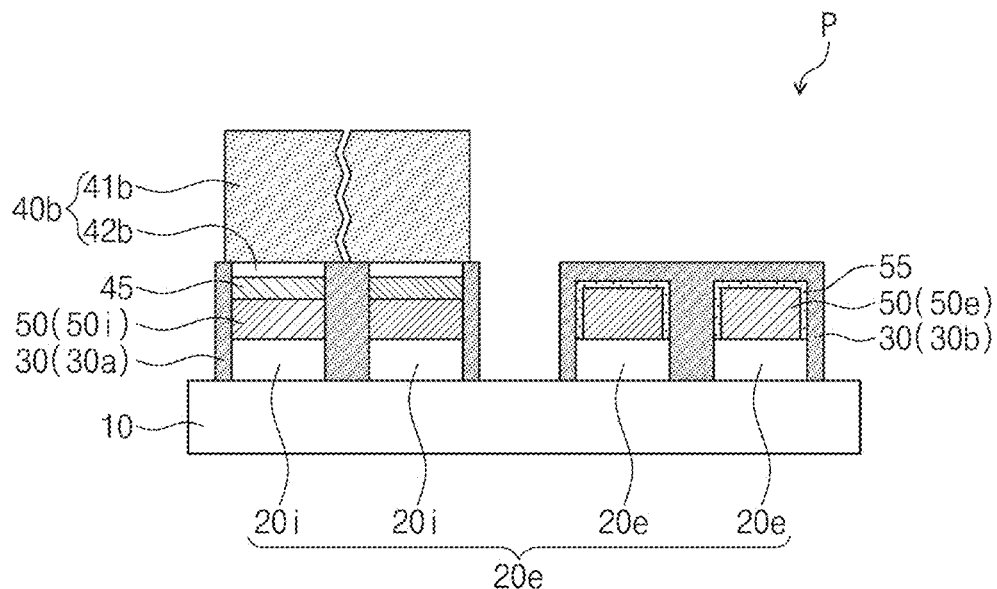
FIGS. 8 and 9 are views illustrating a method of repairing an electronic device according to embodiments of the inventive concept, and correspond to part P of FIG. 2.
Figure 9:
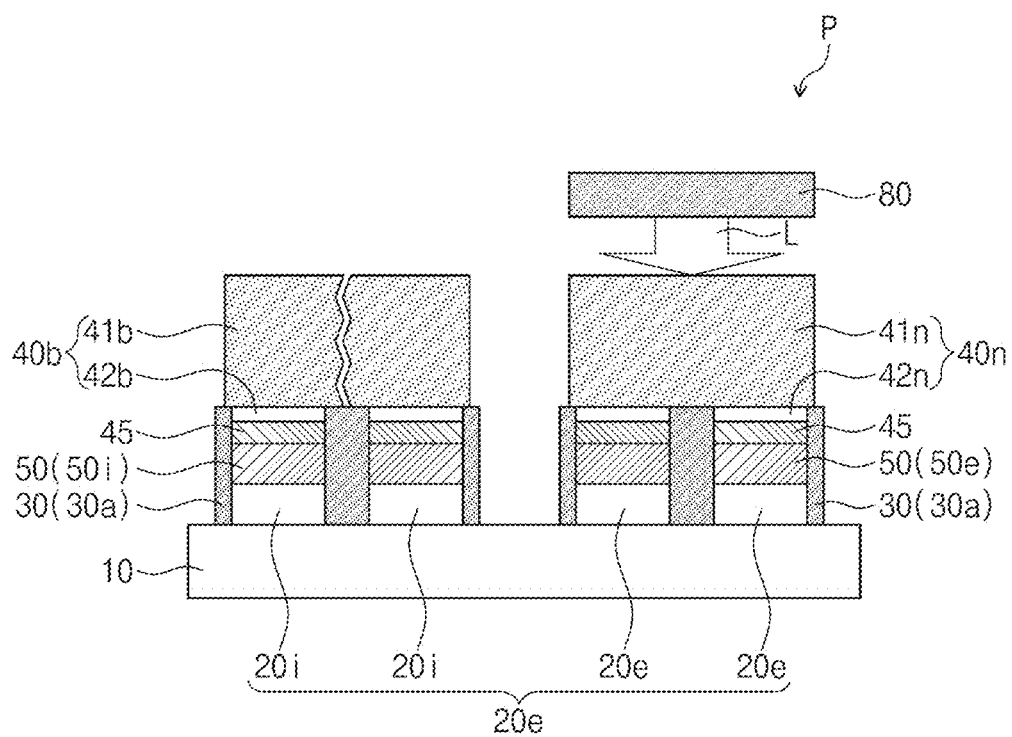

FIGS. 8 and 9 are views illustrating a method of repairing an electronic device according to embodiments of the inventive concept, and correspond to part P of FIG. 2. Hereinafter, a method of repairing an electronic device according to embodiments of the inventive concept will be described with reference to FIGS. 8 and 9. For brevity of description, descriptions of contents overlapping those of FIGS. 1 to 3 will be omitted.

Referring to FIG. 8, an electronic device for performing a repair process may be provided. The electronic device may include a plurality of substrate electrodes 20 on a substrate 10. The substrate electrodes 20 may include initial electrodes 20*i* and spare electrodes 20*e*, and the number ratio of the initial electrodes 20*i* and the spare electrodes 20*e* may be 1:1.

The electronic device may include module structures 40. The module structures 40 may be provided on the initial electrodes 20*i*, respectively, and may be electrically connected to the initial electrodes 20*i*, respectively. The module structures 40 may not be provided on the spare electrodes 20*e*. The module structures 40 may include electronic modules 41 and module electrodes 42. The electronic modules 41 and the module electrodes 42 may have high thermal conductivity.

The electronic device may include solders 50. The solders 50 may include at least one of Sn, or In or combination thereof. The solders 50 may include a composition including at least one of Sn, or In or combination thereof, and for example, may include at least one of Sn, SnAg, SnAgCu, SnIn, In, InBi, SnBi, InBi, or Sn or combination thereof.

Some of the solders 50 may include initial solders 50*i*. The initial solders 50*i* may be disposed between the initial electrodes 20*i* and the module structures 40. Metal compound patterns 45 may be disposed between each of the module structures 40 and each of the initial solders 50*i*. The metal compound patterns 45 may include the same type of metal as the solders 50. The rest of the solders 50 may include spare solders 50*e*. The spare solders 50*e* may be provided on the spare electrodes 20*e* or the new module structures 40*n* of FIG. 9. Oxide layers 55 may be provided on a surface of each of the spare solders 50*e*.

The electronic device may include a bonding material 30 covering the initial electrodes 20*i* and the spare electrodes 20*e*. The bonding material 30 may be in the form of a paste or a film. The bonding material 30 may include a base material, a reducing agent, and a curing agent.

Among the bonding material 30, the bonding material 30*a* on the initial electrodes 20*i* may be harder than the bonding material 30*b* on the spare electrodes 20*e*. The bonding material 30*a* on the initial electrodes 20*i* may be cured by heat.

Specifically, in order to electrically connect the module structures 40 on the initial electrodes 20*i*, a laser may be irradiated to the module structures 40 mounted on the initial electrodes 20*i*. When the laser is irradiated to the module structures 40, the module structures 40, the solders 50, the substrate electrodes 20, and the bonding material 30*a* in the area irradiated with the laser absorb the laser to generate heat. Due to the heat generated at this time, the bonding material 30*a* may be activated. Activation of the bonding material 30*a* may include curing the bonding material 30*a*. Accordingly, the bonding material 30*a* on the initial electrodes 20*i* may be cured by the laser irradiation. However, the bonding material 30a may be transparent, and accordingly, the amount of heat generated by the laser absorption of the bonding material 30a itself may be small.

Alternatively, for example, the laser may not be irradiated to the bonding material 30b on the spare electrodes 20e to which the module structures 40 are not electrically connected. As a result, the bonding material 30b may not be cured.

As another example, the laser may be irradiated to the bonding material 30b on the spare electrodes 20e, but the bonding material 30b may not be cured. In other words, the amount of heat required for curing may not be provided to the bonding material 30b on the spare electrodes 20e. This is because the module structures 40 are not electrically connected to the spare electrodes 20e, so that the amount of the laser absorbed in the area on the spare electrodes 20e may be small. The bonding material 30b may be transparent, and thus the laser absorption rate of the bonding material 30b may be lower than the laser absorption rate of the module structures 40. As a result, the amount of heat generated by laser absorption of the bonding material 30b itself may be small.

Since the bonding material 30b on the spare electrodes 20e is not cured, it may be easy to electrically connect the new module structures 40 on the spare electrodes 20e. That is, a repair process of electrically connecting the new module structures 40 on the spare electrodes 20e may be performed without a separate treatment process for the cured bonding material 30a.

The laser absorption rate of the bonding material 30 may be greater than 0% and less than 30% with respect to the laser having a wavelength of 200 nm or more and 2 μm or less. When the laser absorption rate of the bonding material 30 is 30% or more, due to the self-heating of the bonding material 30, the bonding material 30b on the spare electrodes 20e may be cured.

The thickness t1 of the bonding material 30 may be greater than 0 μm and less than or equal to 70 μm. If the thickness t1 of the bonding material 30 is greater than 70 μm, the laser absorption amount of the bonding material 30 may increase, so that the bonding material 30b on the spare electrodes 20e may be cured.

After the electronic device is provided, at least one or more defective module structures 40b of the module structures 40 may be destroyed. The destruction of the defective module structures 40b may be, for example, disconnecting electrical connections between the defective module structures 40b and the initial electrodes 20i. The destruction of the defective module structures 40b may be, for example, separating the defective module structures 40b from the initial electrodes 20i. However, this is merely exemplary, and the inventive concept is not limited thereto.

Referring to FIG. 9, new module structures 40n may be disposed on corresponding spare electrodes 20e among the spare electrodes 20e. The new module structures 40n may include new electronic modules 41n and new module electrodes 42n. The corresponding spare electrodes 20e may be substantially identical to the initial electrodes 20i to which the defective module structures 40b are connected. The new module structures 40n may be electrically connected to the corresponding spare electrodes 20e through a repair process. By disposing the new module structures 40n, the spare solders 50e may be disposed between the corresponding spare electrodes 20e and the new module structures 40n.

Thereafter, the laser L may be irradiated from the laser light source 80 to the new module structures 40n. The laser L may be irradiated to at least one or more of the new module structures 40n. The laser L may be a surface laser. The laser L irradiation time may be within about 20 seconds. The wavelength of the laser L may be 200 nm or more and 2 μm or less. The laser L absorption rate of the bonding material 30 may be greater than 0% and less than 30%.

As the laser L is absorbed by the new module structures 40n, the spare solders 50e, the corresponding spare electrodes 20e, and the bonding material 30b of FIG. 8, the bonding material 30a on the corresponding spare electrodes 20e may be activated. As the bonding material 30a is activated, the reducing agent included in the bonding material 30a may remove the oxide layers 55 of FIG. 8 on the surface of the spare solders 50e. In addition, the bonding material 30a between each of the new module electrodes 42n of the new module structures 40n and each of the spare solders 50e may be pushed. As a result, metal compound patterns 45 may be formed between each of the new module electrodes 42n and each of the spare solders 50e. The metal compound patterns 45 may be formed by reacting each of the new module electrodes 42n and the spare solders 50e, respectively. The metal compound patterns 45 may be disposed between each of the new module structures 40n and each of the spare solders 50e. The metal compound patterns 45 may include the same metal as the spare solders 50e. After the reaction of the new module electrodes 42n and the spare solders 50e, the thickness of the new module electrodes 42n may be 10 nm or more.

At the same time, the bonding material 30a may be cured by heat. As the bonding material 30a is cured by heat, the new module structures 40n may be fixed on the corresponding spare electrodes 20e.

Although not shown in the drawing, the amount of heat generated on the spare electrodes 20e to which the new module structures 40n is not connected among the spare electrodes 20e may be less than the amount of heat generated on the corresponding spare electrodes 20e. Accordingly, the bonding material 30b on the spare electrodes 20e to which the new module structures 40n are not connected may not be cured. As a result, even if the repair process is repeated two or more times, without a separate treatment for the cured bonding material 30a, a new repair process may be performed on the spare electrodes 20e to which the new module structures 40n are not connected.

Figure 10:
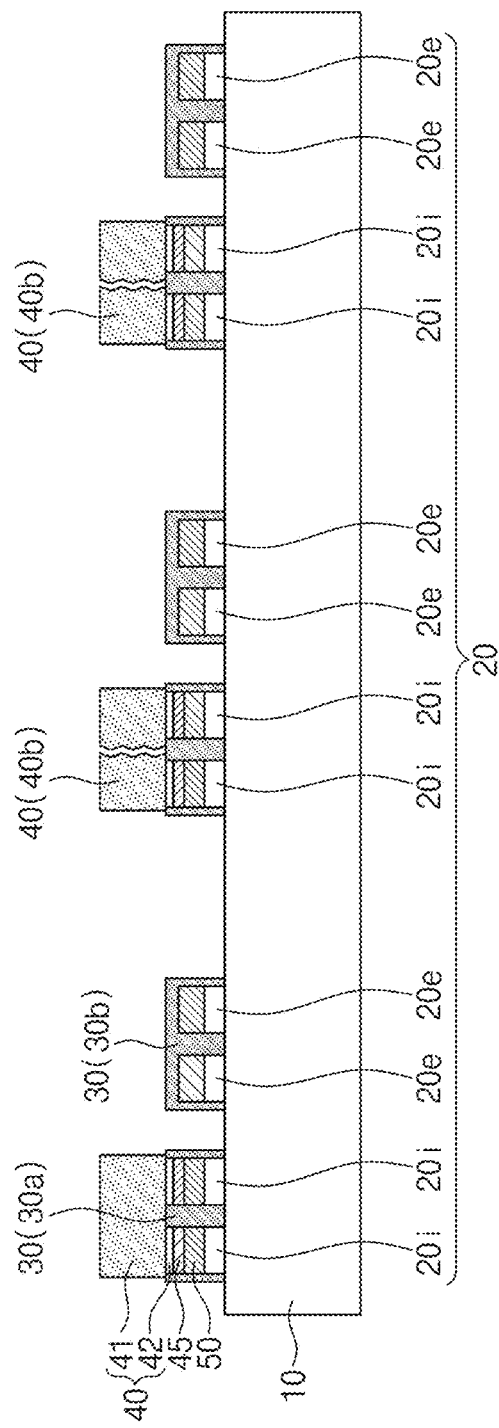
FIGS. 10 to 13 are cross-sectional views illustrating a method of repairing an electronic device according to embodiments of the inventive concept.
Figure 11:
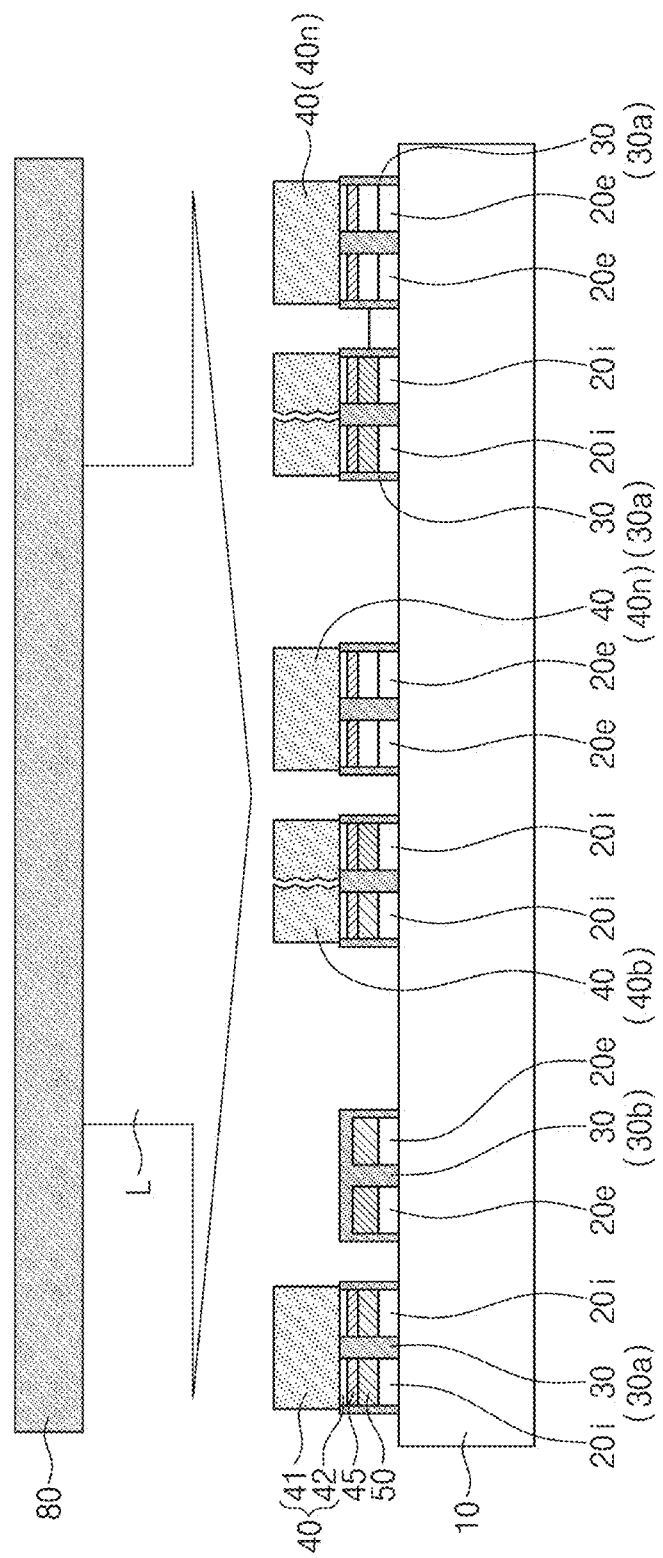

FIGS. 10 and 11 are cross-sectional views illustrating a method of repairing an electronic device according to embodiments of the inventive concept. For brevity of description, descriptions of contents overlapping those of FIGS. 1 to 3, and 8 and 9 will be omitted.

Referring to FIG. 10, the electronic device may include at least one or more of the defective module structures 40b.

Referring to FIG. 11, the new module structures 40n may be disposed on corresponding spare electrodes 20e among the spare electrodes 20e. The corresponding spare electrodes 20e may be substantially identical to the initial electrodes 20i to which the defective module structures 40b are connected, and may replace the initial electrodes 20i to which the defective module structures 40b are connected. The new module structures 40n may be at least one. The number ratio of the new module structures 40n and the defective module structures 40b may be 1:1.

Thereafter, the laser L may be irradiated from the laser light source 80 to the new module structures 40n. The laser L may be simultaneously irradiated to at least one or more of the new module structures 40n. For example, the laser L may be simultaneously irradiated to all of the new module structures 40n.

At the same time, the laser L may be irradiated onto the spare electrodes 20e to which the module structures 40 and the new module structures 40n on the initial electrodes 20i are not connected. In this case, the bonding material 30a on the initial electrodes 20i may be continuously hardened. Conversely, the bonding material 30b on the spare electrodes 20e to which the new module structures 40n are not connected may not be cured. As a result, even if the repair process is repeated two or more times, without a separate treatment for the cured bonding material 30a, a new repair process may be performed on the spare electrodes 20e to which the new module structures 40n are not connected. According to the present embodiments, a repair process for a plurality of defective module structures 40b may be simultaneously performed.

Figure 12:
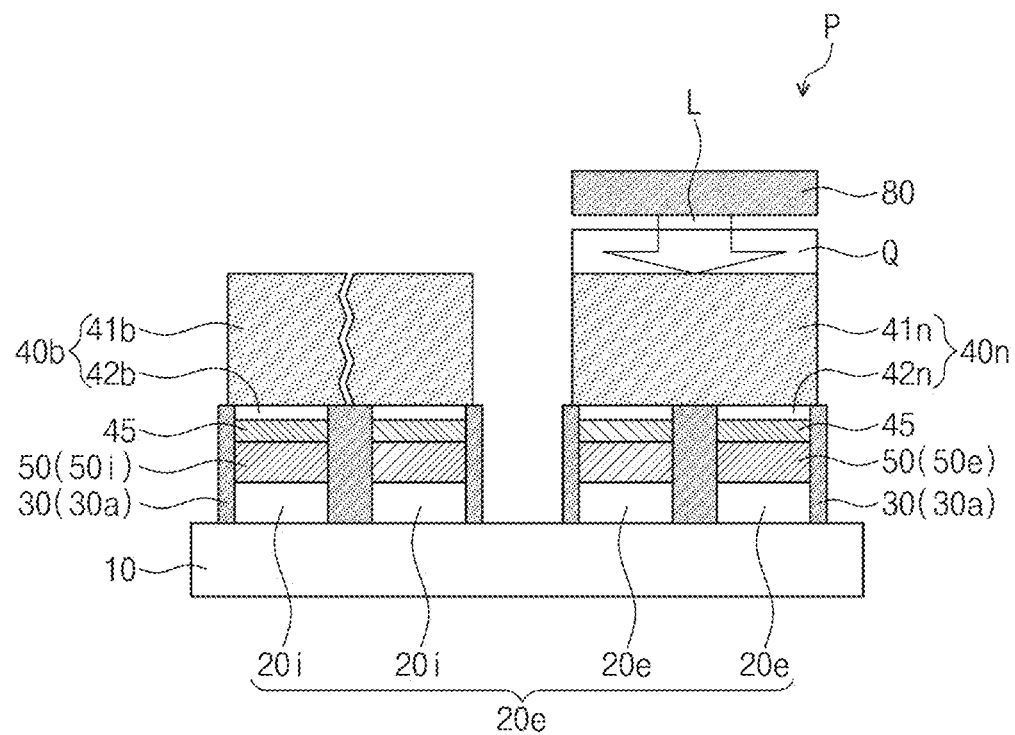
Figure 13:
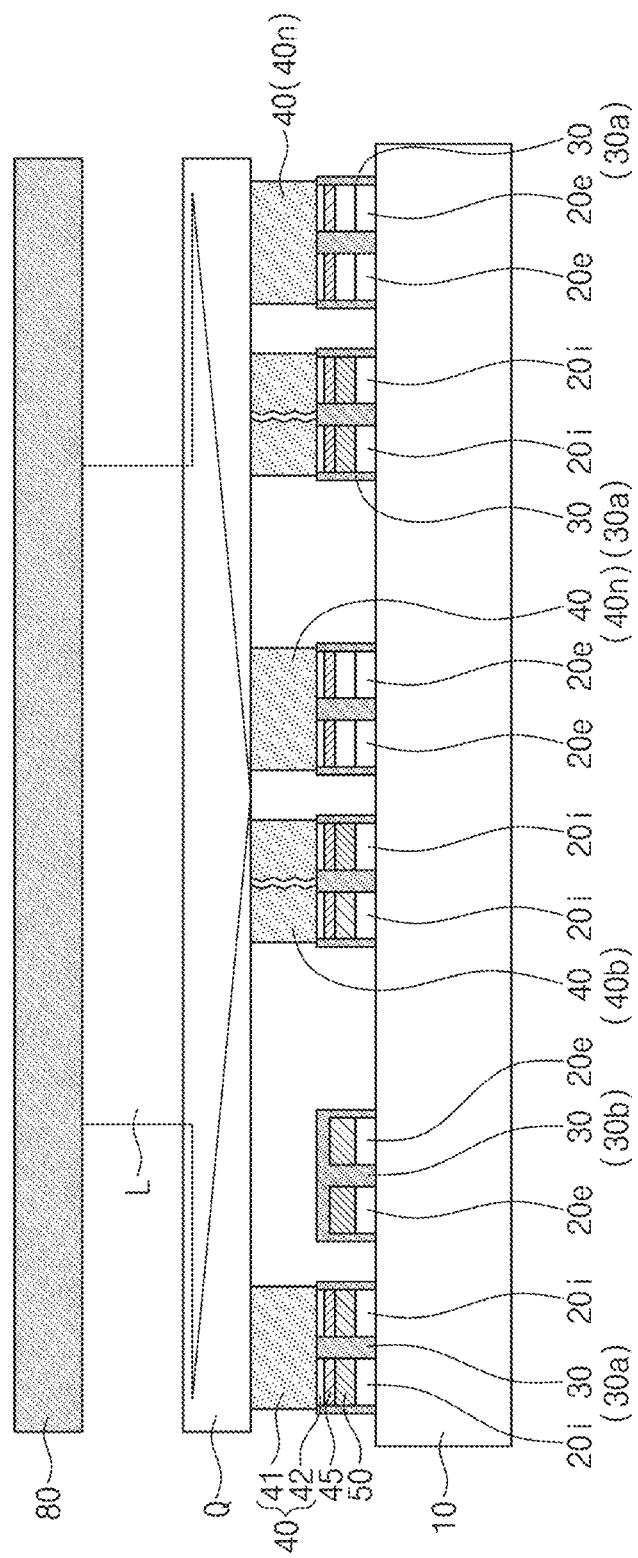

FIGS. 12 and 13 are cross-sectional views illustrating a method of repairing an electronic device according to embodiments of the inventive concept. For brevity of description, descriptions of contents overlapping those of FIGS. 1 to 3, and 8 and 9 will be omitted.

Referring to FIG. 12, a quartz Q may be provided between the laser light source 80 and the new module structures 40n. When the electronic device is thin or has severe bending, pressure may be applied to the electronic device through the quartz Q. The laser L irradiated to the new module structures 40n may pass through the quartz Q and irradiated to the new module structures 40n. During the repair process, in order to minimize the effect of the quartz Q on the laser L, the quartz Q may have a low absorption rate of the laser L.

Referring to FIG. 13, the quartz Q may be provided on at least one or more of the new module structures 40n. Accordingly, the laser L may pass through the quartz Q and be simultaneously irradiated to at least one or more new module structures 40n. At the same time, the laser L may be irradiated onto the spare electrodes 20e to which the module structures 40 and the new module structures 40n on the initial electrodes 20i are not connected through the quartz Q.

Figure 14:
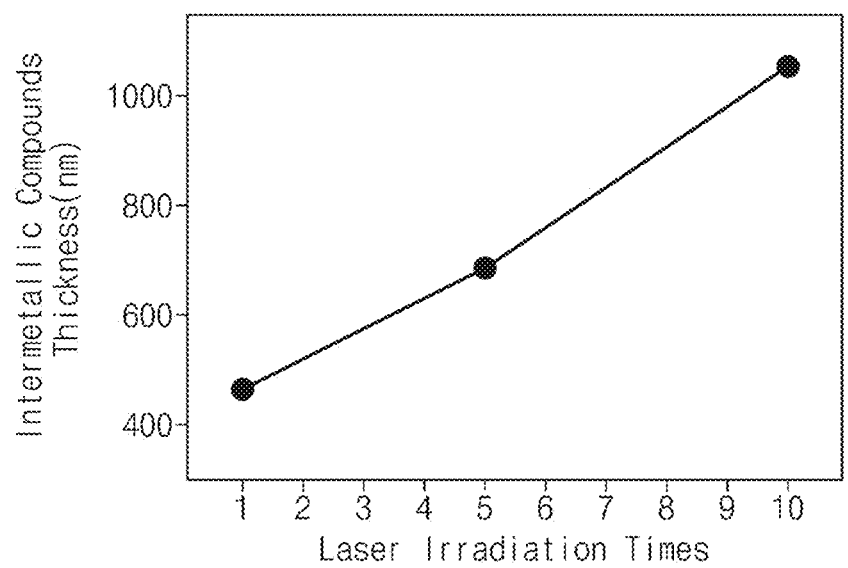
FIG. 14 is a graph illustrating a change in thickness of the metal compound patterns of FIG. 4 according to the number of laser irradiation times.

FIG. 14 is a graph illustrating a change in thickness of the metal compound patterns 45 of FIG. 4 according to the number of laser irradiation times.

Referring to FIG. 14, the thickness t3 of the metal compound patterns 45 of FIG. 3 increases according to the laser irradiation. The metal compound patterns 45 have a thickness of about 432 nm when the laser is irradiated once, about 652 nm when irradiated 5 times, and about 1054 nm when irradiated 10 times. That is, even when the electronic device is repaired 10 times according to embodiments of the inventive concept, the thickness t2 of the metal compound patterns 45 may be 2 µm or less. Accordingly, the thickness reduction amount of the solders 50 of FIG. 3 according to the formation of the metal compound patterns 45 may be 2 µm or less, and as a result, the electrical characteristics of the electronic device may not be deteriorated.

FIGS. 15A to 15D are results of checking whether an electronic device operates according to repeated laser irradiation.

Figure 15A:
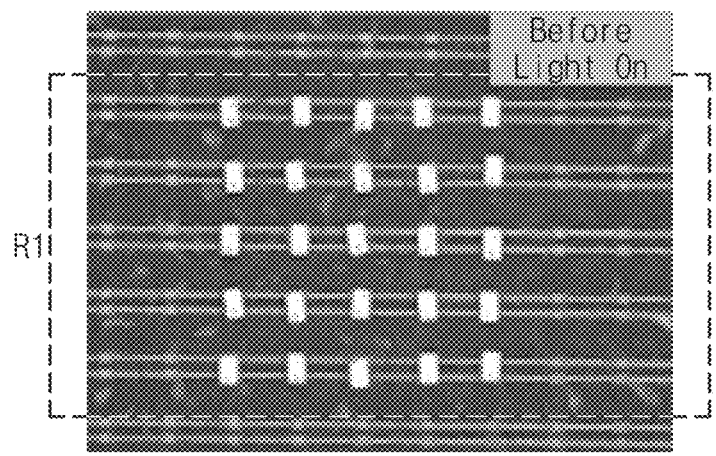
FIGS. 15A to 15D are results of checking whether an electronic device operates according to repeated laser irradiation.

Referring to FIG. 15A, the first LED chips arranged in a 5×5 array were electrically connected to the substrate electrodes in the first area R1. The first LED chips are electrically connected to the substrate electrodes through laser irradiation. The laser was irradiated over the entire area on the substrate.

Figure 15B:
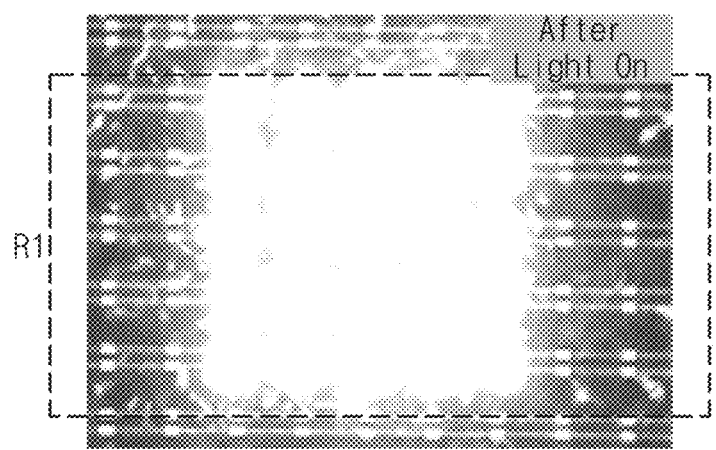

Referring to FIG. 15B, it is confirmed that the first LED chips are turned on. That is, it indicates that the first LED chips may be electrically connected to the substrate electrodes through the laser irradiation.

Figure 15C:
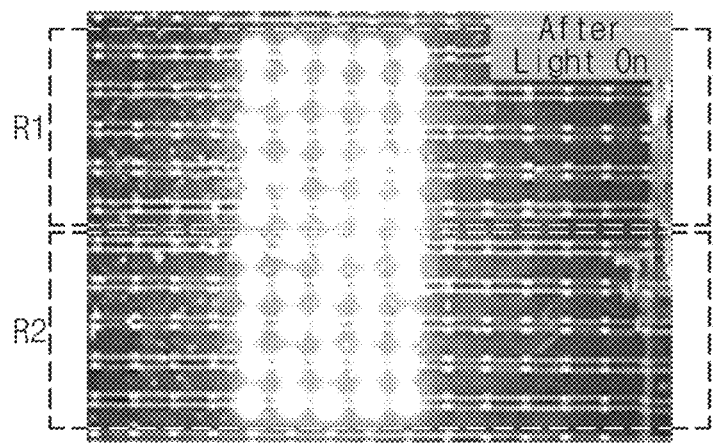

Referring to FIG. 15C, the second LED chips arranged in 5×5 were further electrically connected to the substrate electrodes in the second area R2 and then turned on. The second LED chips in the second area R2 were connected to the substrate electrodes through the laser irradiated to the entire area on the substrate. In the first area R1, it may be confirmed that the first LED chips operate normally even though the laser is irradiated to the first LED chips once more. In the second area R2, the laser is irradiated once before and after the arrangement of the second LED chips, and even in this case, the second LED chips operate normally.

Figure 15D:
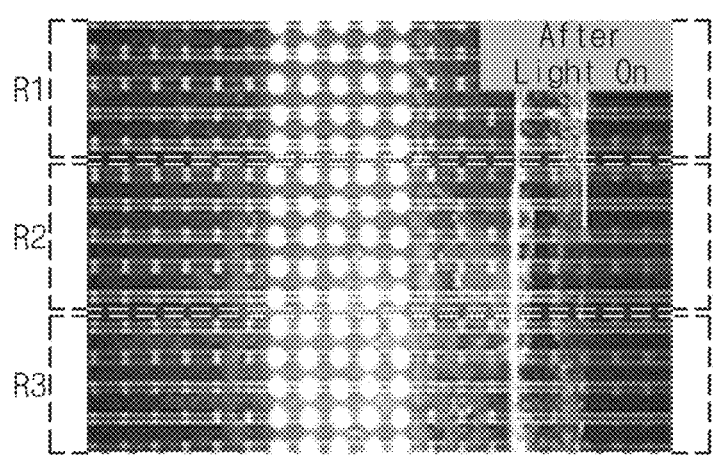

Referring to FIG. 15D, the third LED chips arranged in 5×5 were further electrically connected to the substrate electrodes in the third area R3 and then turned on. The third LED chips in the third area R3 were connected to the substrate electrodes through the laser irradiated to the entire area on the substrate. After the first LED chips and the second LED chips were electrically connected on the substrate electrodes, the laser was irradiated, it may be seen that the first LED chips and the second LED chips operate normally. In the third area R3, the laser is irradiated twice before and once after the third LED chips are disposed, and even in this case, the third LED chips operate normally.

According to the concept of the inventive concept, by providing spare electrodes and a bonding material having a low laser absorption rate on the substrate of the electronic device, the repair process may be performed through laser irradiation without a separate step of removing the hardened bonding material between the defective module structures and the initial electrodes. In addition, since new module structures are provided at the same time, a time and cost required for a repair process may be reduced, and as a result, a production yield of an electronic device product may be increased.

Although the embodiments of the inventive concept have been described, it is understood that the inventive concept should not be limited to these embodiments but various changes and modifications may be made by one ordinary skilled in the art within the spirit and scope of the inventive concept as hereinafter claimed.

What is claimed is:
1. An electronic device comprising:
 a plurality of substrate electrodes on a substrate, the substrate electrodes including initial electrodes and spare electrodes;
 a bonding material covering the initial electrodes and the spare electrodes;
 module structures respectively provided on first initial electrodes of the initial electrodes; and
 solders between each of the first initial electrodes and each of the module structures,
 wherein the spare electrodes comprise second spare electrodes,
 wherein the module structures are not provided on the second spare electrodes,
 wherein the bonding material on the first initial electrodes is harder than the bonding material on the second spare electrodes.
2. The electronic device of claim 1, wherein the number ratio of the initial electrodes and the spare electrodes is 1:1.
3. The electronic device of claim 1, wherein with respect to a laser having a wavelength of 200 nm or more and 2 µm or less, the laser absorption rate of the bonding material is greater than 0% and less than 30%.

4. The electronic device of claim 1, wherein a thickness of the bonding material is greater than 0 um and less than 70 um.

5. The electronic device of claim 1, wherein the bonding material is in a form of a paste or film.

6. The electronic device of claim 1, wherein the bonding material comprise a thermosetting resin, a reducing agent, and a curing agent.

7. The electronic device of claim 1, wherein the solders comprise at least one of Sn, or In or combination thereof.

8. The electronic device of claim 1, further comprising metal compound patterns between each of the module structures and each of the solders,
wherein the metal compound patterns comprise the same metal as the solders.

9. The electronic device of claim 8, wherein a thickness of the metal compound patterns is greater than 0 um and less than 2 um.

10. The electronic device of claim 1, wherein the initial electrodes further comprise second initial electrodes,
wherein the spare electrodes further comprise first spare electrodes,
wherein the module structures are not provided on the second initial electrodes, but are provided on the first spare electrodes, respectively.

11. The electronic device of claim 10, wherein the bonding material on the first spare electrodes is harder than the bonding material on the second spare electrodes.

12. A method of repairing an electronic device including a plurality of substrate electrodes on a substrate, wherein the substrate electrodes include initial electrodes and spare electrodes, a bonding material covering the initial electrodes and the spare electrodes, module structures electrically connected to the initial electrodes, and initial solders between the initial electrodes and the module structures, the method comprising:
curing the bonding material on the initial electrodes more than the bonding material on the spare electrodes;
destroying at least one defective module structure of the module structures;
disposing new module structures on corresponding ones of the spare electrodes; and
curing the bonding material on the corresponding spare electrodes by irradiating a laser to the new module structures,
wherein the bonding material on the first initial electrodes is harder than the bonding material on the second spare electrodes.

13. The method of claim 12, wherein the number ratio of the initial electrodes and the spare electrodes is 1:1.

14. The method of claim 12, wherein the wavelength of the laser is 200 nm or more and 2 µm or less.

15. The method of claim 12, wherein the laser is irradiated to at least one or more of the new module structures at the same time.

16. The method of claim 15, wherein the laser is simultaneously irradiated to the module structures on the initial electrodes.

17. The method of claim 12, further comprising providing spare solders on the spare electrodes or the new module structures,
wherein the oxide layers on the surface of the spare solders are removed by irradiating the laser.

18. The method of claim 17, wherein the new module structures include new module electrodes,
wherein the method further comprises forming metal compound patterns between each of the new module electrodes and each of the spare solders,
wherein the metal compound patterns comprise the same metal as the spare solders.

19. The method of claim 12, wherein the laser irradiated to the new module structures is irradiated to the new module structures through quartz provided between a laser light source and the new module structures.

20. The method of claim 19, wherein the quartz is provided on at least one or more of the new module structures.

* * * * *